US005382907A

United States Patent [19]

Debussche et al.

[11] Patent Number: 5,382,907

[45] Date of Patent: Jan. 17, 1995

[54] DATA INPUT MODULE FOR INPUTTING DATA BY MEANS OF ELECTRICAL CONTACT FOR A MONITORING/CONTROL INSTALLATION

[75] Inventors: Patrick Debussche, Montrouge; Thomas Fisch, Clayes sous Bois, both of France

[73] Assignee: Cegelac, Levallois Perret, France

[21] Appl. No.: 36,833

[22] Filed: Mar. 25, 1993

[30] Foreign Application Priority Data

Mar. 26, 1992 [FR] France ........................ 92 03649

[51] Int. Cl.[6] .................................... G01R 31/02

[52] U.S. Cl. ........................ 324/418; 324/415; 324/538

[58] Field of Search ............ 324/415, 418, 500, 522, 324/537, 538, 126, 133; 340/644; 364/579

[56] References Cited

U.S. PATENT DOCUMENTS

| | | | |
|---|---|---|---|
| 2,900,628 | 8/1959 | Fegely et al. | 324/415 X |
| 3,021,515 | 2/1962 | Christian et al. | 324/538 X |
| 3,239,755 | 3/1966 | Ehlschlager | 324/538 X |
| 3,611,364 | 10/1971 | Jones | 340/644 X |
| 4,854,165 | 8/1989 | Jay | 324/415 X |

FOREIGN PATENT DOCUMENTS

| | | |
|---|---|---|
| 0086689 | 8/1983 | European Pat. Off. . |
| 0101643 | 2/1984 | European Pat. Off. . |
| 2046897 | 4/1972 | Germany . |

*Primary Examiner*—Kenneth A. Wieder
*Assistant Examiner*—Glenn W. Brown
*Attorney, Agent, or Firm*—Sughrue, Mion, Zinn, Macpeak & Seas

[57] ABSTRACT

The invention relates to a data input module for inputting data, by means of electrical contact, to a monitoring/control module, the module including a first voltage feed input (1) and a second voltage feed input (2), which inputs are intended to be subjected to a potential difference which is optionally variable, and a plurality of contacts (3) each of which has a first terminal (4) connected to the first input via a first resistor (14), and a second terminal (5) connected to the second input (2), each contact being designed to open or to close an electric current path between its terminals. The module further includes detection members (7) respectively associated with the contacts. Each detection member is organized to detect the presence or the absence of current flowing between the terminals of the contact with which the detection member is associated. A voltage regulator (10) connected to the two feed inputs (1, 2) feeds the detection members and a test circuit (8, 9) for testing operation of the detection members.

5 Claims, 1 Drawing Sheet

DATA INPUT MODULE FOR INPUTTING DATA BY MEANS OF ELECTRICAL CONTACT FOR A MONITORING/CONTROL INSTALLATION

BACKGROUND OF THE INVENTION

The invention relates to a data input module for inputting data by means of electrical contact for a monitoring/control installation.

Such a module is disclosed in Document EP-0101643. That module is designed primarily to detect a command input via an electrical contact and to supply necessary data to a monitoring/control installation. In Document EP-0101643, the electrical contact, e.g. a push button, is electrically connected to a detection member such as an optocoupler. That module is organized to incorporate only one electrical contact and only one detection member. Moreover, that known module does not include a test circuit for testing operation of the detection member.

Currently, standardizing manufacture of this type of data input module is desired so as to reduce its cost given that a module must be capable of including a plurality of contacts and a plurality of detection members, each detection member being associated with a contact and being installed on a support such as a printed circuit card. Furthermore, the potential difference across the feed inputs of such a module may vary to a large extent, e.g. in the range 48 volts to 127 volts, depending on the installation which receives the module. Therefore, in each individual case and as a function of the feed potential difference of the module, it is currently necessary to adapt the characteristics of the detection member contained in the module, and the number of contacts that can be implemented because of the problems due to the effects of heat dissipation from components on the support. Currently, when the potential difference to which the feed inputs of a module are subjected is 48 volts, 16 contacts can be implemented. When the potential difference is 127 volts, only 8 contacts can be implemented, in order to keep the dissipated power below a certain level.

In order to mitigate that drawback, a voltage regulator, e.g. a chopper voltage regulator, could be used having an output connected to the first terminal of the contact via the detection member, the output delivering a voltage that is lower than the optionally variable voltage applied to the first input of the module.

However, it is desired to use such a module with a plurality of contacts, each of which may require a minimum defined potential difference across its terminals for reliable operation, which potential difference is that across the inputs of the module. The minimum potential difference is such that, on contact closing, a self-cleaning spark is produced between the terminals of the contact. Otherwise, the terminals of the contact become oxidized over time, and the contact becomes isolating even when it is actuated.

SUMMARY OF THE INVENTION

An object of the invention is to provide a data input module which satisfies the following requirements:

- the feed inputs can be subjected to a variable potential difference, e.g. in the range 48 volts to 127 volts;
- the detection members remain subjected to a low potential difference, e.g. 24 volts or less, to limit the effects of heat dissipation;
- the contacts remain subjected to the feed potential difference of the module to ensure that the contact is cleaned on closing;
- the current is constant (10 mA) when the contact is closed in order to avoid oxidation phenomena; and
- the module includes a test circuit for testing low-voltage operation of the detection members, which circuit is simple, reliable, and ensures constant test times.

To this end, the invention provides a data input module for inputting data by means of electrical contact for a monitoring/control module, the module comprising:

a) a first voltage feed input and a second voltage feed input, which inputs are intended to be subjected to a potential difference which is optionally variable;

b) a plurality of contacts each of which has a first terminal electrically connected to said first input via a first resistor, and a second terminal electrically connected to said second input, each contact being designed to open or to close an electric current path between its terminals when it is actuated;

c) a plurality of detection members respectively associated with said contacts, each detection member being organized to detect the presence or the absence of an electric current flowing between the terminals of the contact with which the detection member is associated, and to respond to the contact being actuated by producing a signal representing data input;

d) a voltage regulator electrically connected to the two feed inputs and having an output which supplies a regulated voltage to the detection members, each detection member being electrically connected to the first terminal of the contact with which the detection member is associated: and e) a test circuit for testing operation of the detection members, which circuit is interposed firstly between the output of the regulator and each detection member, and secondly between each detection member and the second feed input, the circuit being intended both to feed said contacts via the detection members, and also to short-circuit them.

With this design, each contact remains subjected to the potential difference fed to the module, which difference may vary. Each detection member receives a voltage which may be lower than the voltage applied to the first input, thereby enabling the same detection member to be used for modules fed with variable voltages. As a result, the consumption of such a module is reduced, thereby limiting the effects of heat dissipation, and making it possible to increase the number of detection members that can be implemented on the same support. By choosing the resistances of the resistors appropriately, the current that the detection member is to detect can be adjusted such that it is sufficient but not too high. The operation test circuit is directly integrated into the module and may be easily implemented. The test circuit makes it possible to test operation of each detection member regardless of the potential difference applied to the input terminals of the module.

In a preferred embodiment, the circuit comprises:

a) a first test component interposed between the output of the voltage regulator and each detection member, the first test component having a first state in which the output of the regulator is electrically connected to each detection member, and a second state in which the output of the regulator is electrically isolated from each detection member; and b) a second test component interposed between each detection member and the second feed input, the second test component having a first state in which each detection member is electrically connected to the second feed input, and a second state in which each detection member is electrically isolated from the second feed input.

The test components may be semiconductor components.

Each detection member associated with a contact is electrically connected firstly to the first terminal of the contact via a resistor and via a first diode, and secondly to the second feed input via said resistor, via a second diode and via the second test component.

A detailed description of an embodiment of the invention is given below with reference to the accompanying drawing, in which:

DESCRIPTION OF A PREFERRED EMBODIMENT

Figure 1:
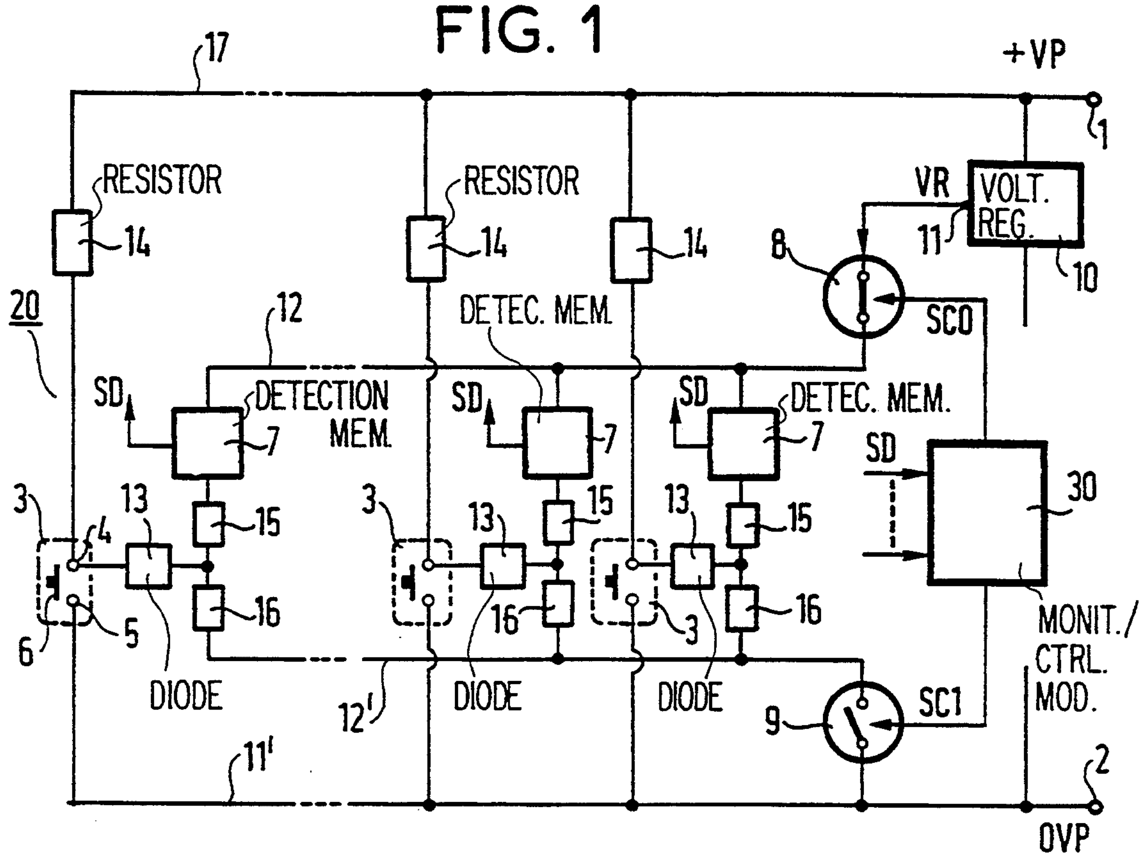
FIG. 1 is a circuit diagram of a logical data input module of the invention including test components for testing detection member operation.

In FIG. 1, the data input module 20 for inputting data via electrical contacts includes two voltage feed inputs 1, 2, one of which (1) receives a voltage +VP, and the other of which (2) receives a voltage 0VP. The potential difference +VP–0VP may have any value lying in the range 48 volts to 127 volts. A conventional chopper voltage regulator 10 is connected to the two inputs 1, 2 to produce a regulated voltage VR at an output 11, which regulated voltage is less than voltage +VP, and is, for example, equal to 24 volts.

The module 20 also includes a plurality of electrical contacts 3, three of which are shown. Each contact 3 has two terminals 4, 5, and one contact member 6 which, when it is actuated, establishes electrical contact between the terminals 4, 5. The contacts are shown in the rest position in the figure. In the rest position, the terminals 4, 5 are not electrically interconnected via the contact member. The module 20 further includes a plurality of detection members 7, each of which is associated with a respective contact 3. Each detection member, which may be a conventional optocoupler, is responsive to an electric current being passed when the contact associated with the detection member is actuated, and the detection member supplies a logical data input signal SD which represents the current to a monitoring/control installation 30.

The output 11 of the chopper voltage regulator is connected to terminal 4 of each of the contacts 3 via the line 12, and via the detection member 7 which is associated with the contact. Each detection member thus receives the regulated voltage via the line 12.

Input 1 is also connected to terminal 4 of each contact 3 via a line 17, and via a first resistor 14, and input 2 is connected to terminal 5 of each contact via a line 11'. Terminal 4 of each contact 3 is connected to the detection member 7 via a decoupling diode 13 and a second resistor 15. The terminals 4, 5 of each contact 3 are thus subjected to the entire potential difference +VP–0VP. Each diode 13 protects the detection member 7 to which it is connected by allowing electric current to pass only from the detection member to the terminal 4 of the contact that is associated with the detection member. Resistors 15 have resistances such that the current detected by a detection member 7 when the contact associated therewith is actuated is sufficient without being too great. To obtain a current of about 10 mA, each resistor 15 has a resistance of 24 kohms. Resistors 14 have high resistance, e.g. 120 kohms, thereby limiting the current flowing between the terminals of each contact when the contact is actuated. This layout enables the power dissipated by the module to be limited considerably.

The module 20 also includes test components for testing detection member operation, which components enable contact actuation or non-actuation to be simulated. A first test component 8 is interposed between the output 11 of the chopper voltage regulator and each detection member 7. Test component 8, which may be a semiconductor component such as a transistor, is controlled by a signal SC0 generated by the monitoring/control installation 30. In response to signal SC0, test component 8 opens line 12.

Input 2 is connected to each resistor 15 via a line 12', via decoupling diodes 16, and via a second test component 9 similar to component 8. Line 12' is normally open circuit. Test component 9 is controlled by a signal SC1 generated by the monitoring/control installation 30. In response to signal SC1, test component 9 closes line 12'.

Figure 2:
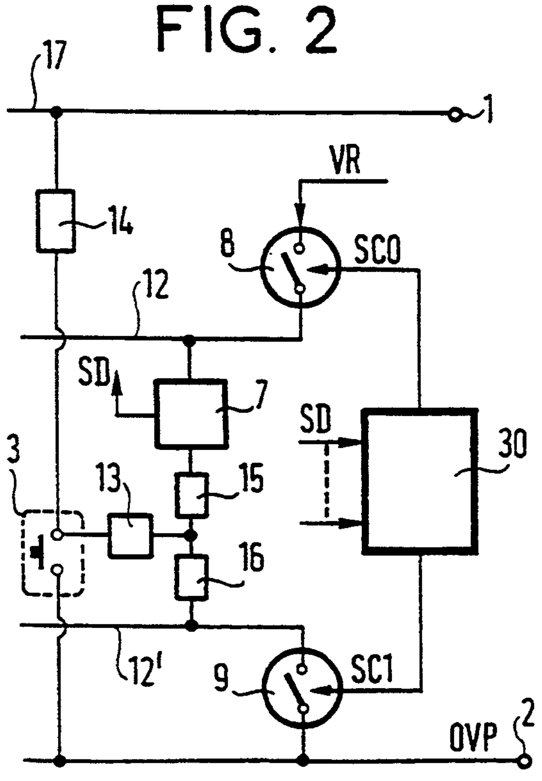
FIG. 2 is a circuit diagram of the logical data input module in FIG. 1 when a first control mode is used to control the test components.

When the monitoring/control installation generates signal SC0, test component 8 opens line 12 as shown in FIG. 2. The detection members 7 are no longer fed with voltage although some contacts 3 might be actuated. The monitoring/control installation can then verify that no detection member is supplying a detection signal SD. This test mode simulates detection member operation when the contacts are in the rest position.

Figure 3:
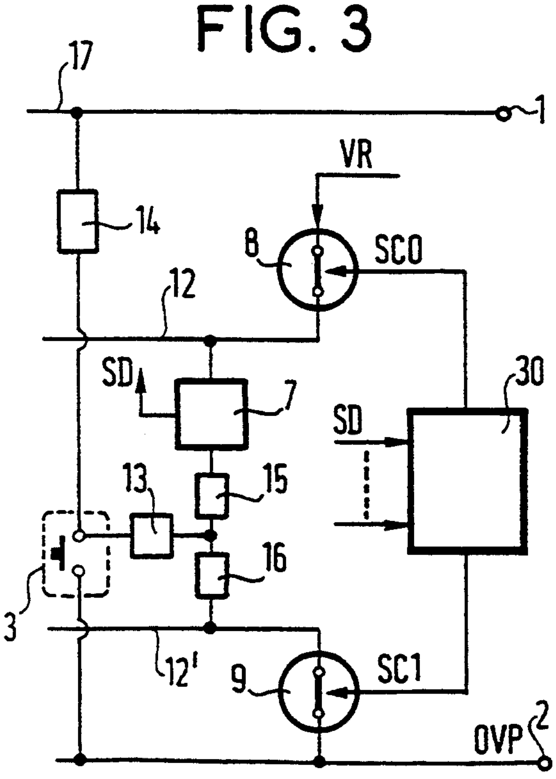
FIG. 3 is a circuit diagram of the logical data input module in FIG. 1 when a second control mode is used for controlling the test components.

When the monitoring/control installation generates signal SC1, test component 9 closes line 12' as shown in FIG. 3. Detection members 7 are fed with voltage and should detect a current although some contacts are in the rest state. The monitoring/control installation can then verify that all the detection members are supplying a signal SD. This test mode simulates detection member operation when the contacts are actuated.

Since the test components 8, 9 are fed with the regulated voltage VR, the time taken by each test component to open or to close the line to which it is connected is independent of the variations in the feed potential difference of the module. This is advantageous in the event that the instants at which detection member operation is tested must be timed very accurately and uniformly regardless of such variations.

Naturally, the invention is not limited to the above-described embodiment, and other variants may be provided without going beyond the ambit of the invention.

We claim:

1. A data input module for inputting data signals (SD) by means of electrical contact to a monitoring/control module, the data input module comprising:

a) a first voltage feed input (1) and a second voltage feed input (2), which inputs are adapted to be subjected to a variable potential difference;

b) a plurality of contacts (3) each of which has a first terminal (4) electrically connected to said first input via a first resistor (14), and a second terminal (5) electrically connected to said second input (2), each contact, when actuated, functioning to open or to close an electric current path between said first and second terminals;

c) a plurality of detection members (7) respectively associated with said contacts (3), each detection member detecting the presence or the absence of an electric current flowing between the terminals of the contact with which the detection member is associated, and responding to the contact being actuated by producing a data signal (SD) representing said electric current;

d) a voltage regulator (10) electrically connected to the two feed inputs (1, 2) and having an output (11) which supplies a regulated voltage to the detection members, each detection member being electrically connected to the first terminal (4) of the contact with which the detection member is associated; and e) a test circuit (8, 9) for testing the detection members by simulating operation thereof, which circuit is interposed firstly between the output (11) of the regulator and each detection member (7), and secondly between each detection member (7) and the second feed input (2), the test circuit functioning both to teed current to said contacts via the detection members, and also to short-circuit said contacts.

2. A data input module according to claim 1, in which the test circuit further comprises:

a) a first test component (8) interposed between the output (11) of the voltage regulator and each detection member (7), the first test component having a first state in which the output of the regulator is electricaly connected to each detection member, and a second state in which the output of the regulator is electrically isolated from each detection member; and b) a second test component (9) interposed between each detection member (7) and the second feed input (2), the second test component having a first state in which each detection member is electrically connected to the second feed input, and a second state in which each detection member is electrically isolated from the second feed input.

3. A data input module according to claim 2, in which each detection member associated with a contact is electrically connected firstly to the first terminal (4) of the contact via a resistor (15) and via a first diode (13), and secondly to the second feed input (2) via said resistor (15), via a second diode (16) and via the second test component (9).

4. A field contact inputs module for inputting data, comprising:

a) first (1) and second (2) module terminals for connection to a source of DC voltage (+VP);

b) a plurality of contacts (3), each having a first contact terminal (4), connected to said first module terminal (1) via a first resistor (14), and a second contact terminal (5) connected to said second module terminal (2), in such a way to be energized by the DC voltage of the source;

c) a voltage regulator (10) connected to said first and second module terminals (1,2) to be energized by said DC voltage of the source and providing a regulated voltage (VR) to a plurality of detection members (7), each detection member (7) being connected to an output (11) of said voltage regulator, and to the first contact terminal (4) of a contact (3) via a first diode (13) and a second resistor (15), to detect the presence or the absence of an electric current flowing between the first and second contact terminals (4, 5) of said contact; and d) a test circuit for testing operation of the detection members (7), said test circuit comprising a first switch (8) between said detection members (7) and the output (11) of said voltage regulator, a second switch (9) between said detection members (7) and the second module terminal (2), and a second diode (16) between each second resistor (15) and said second switch (9); said first switch (8) functioning to electrically connect or disconnect the output of said voltage regulator to or from all the detection members (7) in response to a first test signal (SC0), and said second switch (9) functioning to electrically connect or disconnect all the detection members (7) to or from said second module terminal (2) in response to a second test signal (SC1).

5. The module of claim 4, wherein said first and second switches (8, 9) are semiconductor components.

* * * * *